(12) United States Patent
Kim

(10) Patent No.: US 9,276,230 B2
(45) Date of Patent: Mar. 1, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-do (KR)

(72) Inventor: Tae-Joon Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/933,003

(22) Filed: Jul. 1, 2013

(65) Prior Publication Data

US 2014/0166996 A1    Jun. 19, 2014

(30) Foreign Application Priority Data

Dec. 14, 2012    (KR) .................. 10-2012-0146443

(51) Int. Cl.
*H01L 29/08*    (2006.01)
*H01L 51/52*    (2006.01)
*H01L 27/32*    (2006.01)

(52) U.S. Cl.
CPC ........ *H01L 51/5203* (2013.01); *H01L 27/3276* (2013.01); *H01L 51/5218* (2013.01)

(58) Field of Classification Search
CPC ........................ G06F 3/0488; G06F 3/04883
USPC ................................. 257/40, 59, 72
See application file for complete search history.

(56) References Cited

U.S. PATENT DOCUMENTS

| 7,697,094 B2 * | 4/2010 | Yang et al. ............ 349/114 |
| 2002/0104995 A1 * | 8/2002 | Yamazaki ........ H01L 27/3265 257/72 |
| 2007/0045617 A1 * | 3/2007 | Lee ............ H01L 27/3276 257/40 |
| 2009/0236592 A1 * | 9/2009 | Seo ............... G02F 1/1368 257/40 |
| 2011/0018000 A1 * | 1/2011 | Choi ............ H01L 27/1288 257/72 |
| 2011/0175874 A1 * | 7/2011 | Wakimoto et al. ......... 345/207 |
| 2011/0261305 A1 * | 10/2011 | Choi ............... G02F 1/133555 349/114 |

FOREIGN PATENT DOCUMENTS

| KR | 2002-0064011 | 8/2002 |
| KR | 10-2008-0051220 | 6/2008 |
| KR | 10-2011-0124534 | 11/2011 |

* cited by examiner

*Primary Examiner* — Cuong Q Nguyen
*Assistant Examiner* — Nishath Yasmeen
(74) *Attorney, Agent, or Firm* — Christie, Parker & Hale, LLP

(57) ABSTRACT

An organic light-emitting display apparatus includes: a substrate; a display part on the substrate and configured to display an image, the display part including a thin-film transistor (TFT) and an organic light-emitting diode (OLED); and a pad electrode on the substrate and outside the display part, and the pad electrode includes an embossed-shaped conductive reflective layer.

11 Claims, 8 Drawing Sheets

FIG. 7
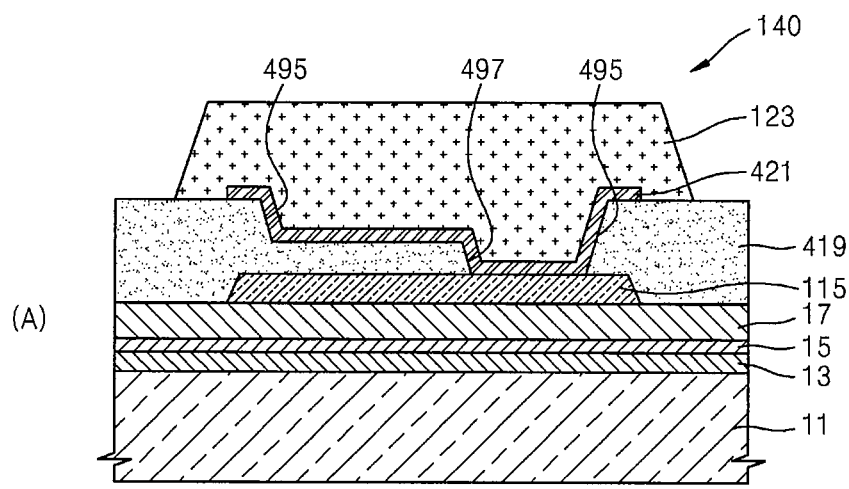
(A)
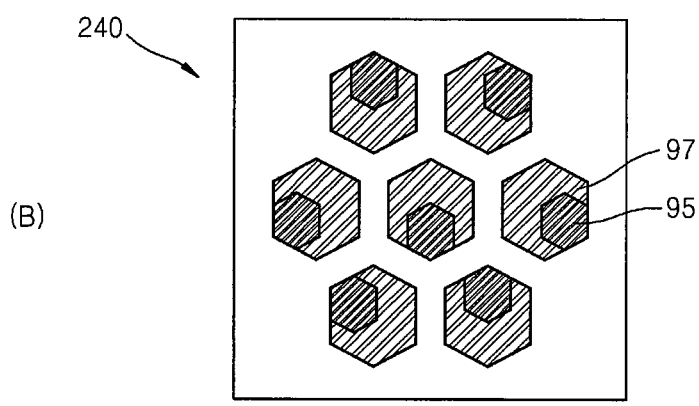
(B)

ORGANIC LIGHT-EMITTING DISPLAY APPARATUS AND METHOD OF MANUFACTURING THE SAME

CROSS-REFERENCE TO RELATED PATENT APPLICATION

This application claims priority under 35 U.S.C. §119 to and the benefit of Korean Patent Application No. 10-2012-0146443, filed on Dec. 14, 2012, in the Korean Intellectual Property Office, the disclosure of which is incorporated herein in its entirety by reference.

BACKGROUND

1. Field

One or more aspects of the present invention relate to an organic light-emitting display apparatus and a method of manufacturing the same, and more particularly, to an organic light-emitting display apparatus for using a pad electrode, which includes an embossing-shaped (or embossed-shape) conductive reflective layer and a method of manufacturing the same.

2. Description of Related Art

An organic light-emitting display apparatus is a self-emission display which is formed by using an organic light-emitting diode (OLED) that includes a hole-injection electrode, an electron-injection electrode, and an organic light-emitting layer formed therebetween. The organic light-emitting display apparatus emits light when excitons, which are generated when holes injected from the hole-injection electrode and electrons injected from the electron-injection electrode are combined, drop from an excitation state to a ground state.

Since an organic light-emitting display apparatus which is a self-emission display generally does not use (or need) an additional power source, it may be driven with a low voltage, and may be formed of a light film. Additionally, an organic light-emitting display apparatus may provide higher-quality characteristics such as a wider viewing angle, higher contrast, and a more rapid response. Thus, it generally gains a lot of attention as a next-generation display apparatus.

SUMMARY

One or more aspects of the present invention provide an organic light-emitting display apparatus for using a pad electrode which includes an embossing-shaped conductive reflective layer, and a method of manufacturing the same. In embodiments of the present invention, efficiency of ultraviolet (UV) utilization may be improved by attaching a display panel module to a front plate, and a pad electrode for reducing wiring resistance may be provided.

According to an aspect of the present invention, there is provided an organic light-emitting display apparatus, including: a substrate; a display part on the substrate and configured to display an image, the display part including a thin-film transistor (TFT) and an organic light-emitting diode (OLED); and a pad electrode on the substrate and outside the display part, and the pad electrode includes an embossed-shaped conductive reflective layer.

The pad electrode may further include a conductive layer below the conductive reflective layer, and the conductive layer may be electrically coupled to the TFT or the OLED and may be configured to transmit an external signal.

The organic light-emitting display apparatus may further include an insulating member at a partial area between the conductive layer and the conductive reflective layer, and the conductive layer and the conductive reflective layer may be electrically coupled to each other in a remaining area.

The insulating member may include a plurality of insulating members, and a height of at least one insulating member may be different from a height of other insulating members.

The conductive reflective layer may include a plurality of embossed shapes having different heights.

The conductive reflective layer may be electrically coupled to the TFT or the OLED, and may be configured to transmit an external signal.

The OLED may include an anode electrode layer, an organic light-emitting layer on the anode electrode layer, and a cathode electrode layer on the organic light-emitting layer, and the conductive reflective layer may be at the same layer as the anode electrode layer.

The conductive reflective layer may include a same material as the anode electrode layer.

The TFT may include an active layer, a gate electrode insulated from the active layer, an interlayer insulating member which covers the gate electrode, and a source electrode and a drain electrode, which are on the interlayer insulating member and contact the active layer, and the conductive layer may be at the same layer as the source electrode and the drain electrode.

The conductive layer may include a same material as the source electrode and the drain electrode.

The pad electrode may further include a protective layer on the conductive reflective layer.

According to another aspect of the present invention, there is provided an organic light-emitting display apparatus, including a display part and a pad part outside of the display part, and a pad electrode on the pad part includes: a conductive layer electrically coupled to the display part; a plurality of insulating members on the conductive layer; and a conductive reflective layer which covers the conductive layer and the insulating members and having an embossed shape.

The conductive layer and the conductive reflective layer may be electrically coupled to each other.

The pad electrode may correspond to one of a data line, a scanning line, or a power-supply line.

According to another aspect of the present invention, there is provided a method of manufacturing an organic light-emitting display apparatus, the method including: sequentially forming an active layer, a gate insulating member, a gate electrode, and an interlayer insulating member on a TFT; forming a source electrode and a drain electrode which contact the active layer in a first area on the interlayer insulating member, and forming a conductive layer in a second area on the interlayer insulating member; forming a planarization layer which covers the source electrode and the drain electrode, and forming an insulating layer which covers the conductive layer; forming at least one insulating member by patterning the insulating layer; and forming an anode electrode of an OLED, the anode electrode contacting the drain electrode, and forming a conductive reflective layer which covers the conductive layer and the at least one insulating member, on the planarization layer.

The conductive reflective layer may have an embossed shape.

The conductive layer and the conductive reflective layer may be electrically coupled to the TFT or the OLED.

The forming of the at least one insulating member may include a half-tone exposure process.

The source electrode and the drain electrode may be formed concurrently with the conductive layer.

The anode electrode may be formed concurrently with the conductive reflective layer.

The conductive reflective layer may include ITO/Ag/ITO.

The method may further include forming a pixel-defining layer on the planarization layer and the anode electrode, and forming a protective layer on the conductive reflective layer.

BRIEF DESCRIPTION OF THE DRAWINGS

The above and other features and aspects of the present invention will become more apparent by describing in detail example embodiments thereof with reference to the attached drawings in which:

FIGS. 5 through 9 are schematic diagrams illustrating a pad electrode of the organic light-emitting display apparatus of FIG. 2, according to other embodiments of the present invention.

DETAILED DESCRIPTION

Figure 1:
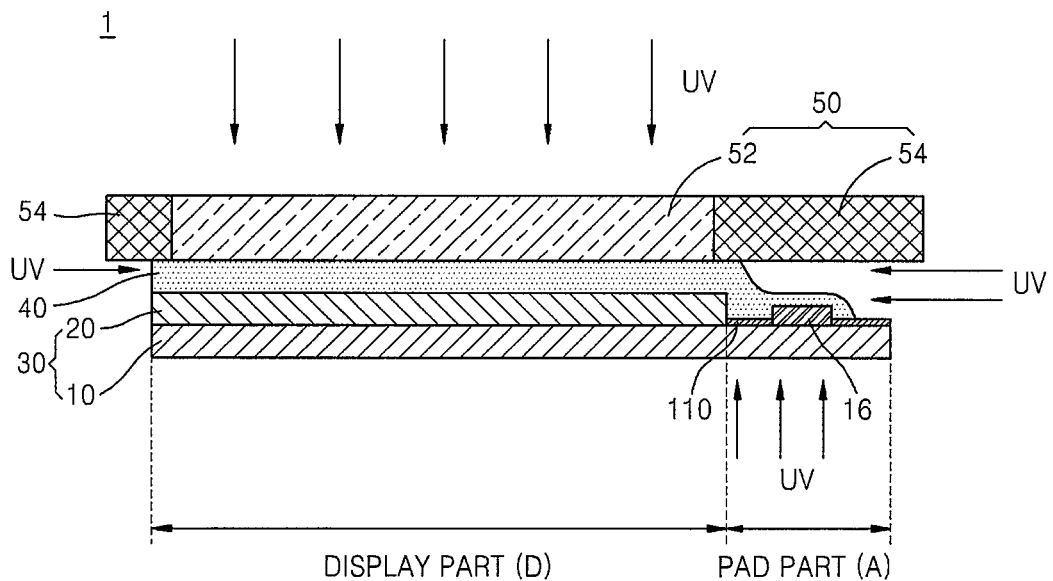
FIG. 1 is a cross-sectional view for explaining a process of attaching a display panel module of an organic light-emitting display apparatus to a top plate, according to an embodiment of the present invention.

The present invention will now be described more fully with reference to the accompanying drawings, in which example embodiments of the invention are shown. Like reference numerals in the drawings denote like elements, and thus their description will may be omitted. In the drawings, the lengths and sizes of elements may be exaggerated for clarity and convenience of description.

This invention may be embodied in many different forms and should not be construed as limited to the example embodiments set forth herein. For example, it will be understood that when a layer is referred to as being "on" or "on the top of" another layer, the layer can be directly on another layer or intervening layers may be present therebetween.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes," and/or "including," when used herein, specify the presence of stated steps, operations, and/or elements, but do not preclude the presence or addition of one or more other steps, operations, and/or elements. It will be understood that, although the terms, 'first', 'second', etc. may be used herein to describe various elements, these elements should not be limited by these terms. These terms are only used to distinguish one element from another.

If an embodiment can be implemented otherwise, a particular process may be executed other than described.

In a case that an embodiment may be implemented otherwise, a particular process may be executed in an order other than described. For example, two processes, sequentially described herein, may be executed concurrently (e.g., at the same time) or in a reverse order of that described.

Figure 2:
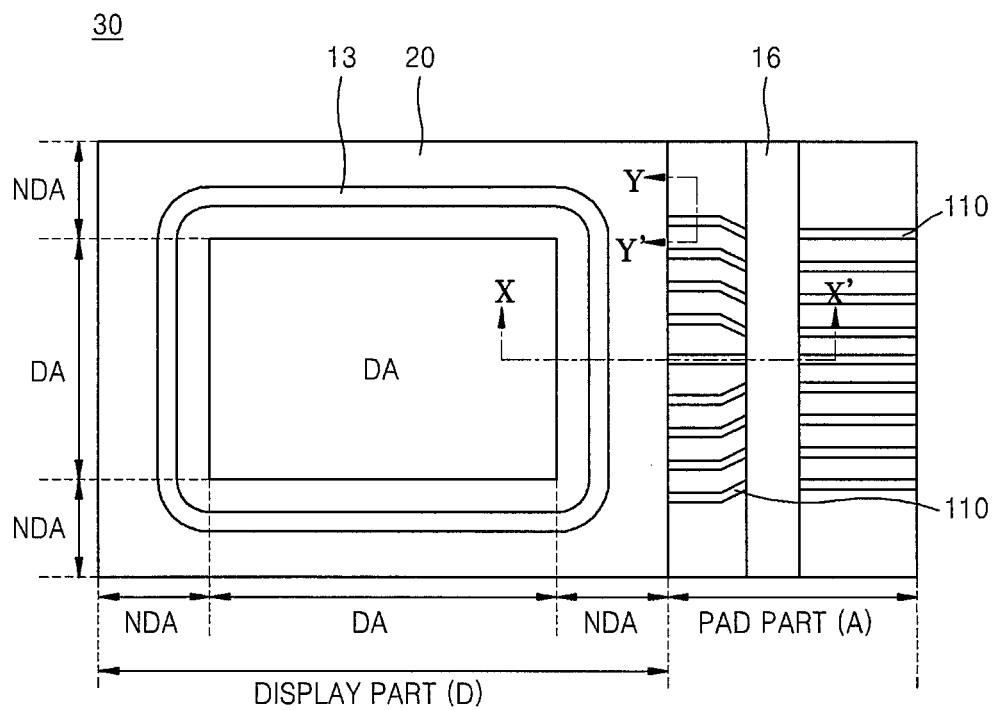
FIG. 2 is a schematic plan view of a structure of the display panel module of FIG. 1.

FIG. 1 is a cross-sectional view for explaining a process of attaching a display panel module 30 of an organic light-emitting display apparatus 1 to a top plate 50, according to an embodiment of the present invention. FIG. 2 is a schematic plan view of a structure of the display panel module 30 of FIG. 1.

Referring to FIG. 1, the organic light-emitting display apparatus 1 includes the display panel module 30 and the top plate 50. Additionally, referring to FIGS. 1 and 2, the display panel module 30 includes a substrate 10 and a sealing substrate 20, and may be divided into a display part D and a pad unit (or pad part) A.

A thin film transistor (TFT), an organic light-emitting diode (OLED) EL, and a capacitor Cst may be formed on the display part D on the substrate 10. The sealing substrate 20 may keep the TFT and the OLED EL included on the substrate 10 away from external moisture and air. The sealing substrate 20 may be a glass substrate or a plastic substrate. The substrate 10 and the sealing substrate 20 may be bonded using a sealing member 13 disposed along edges of the substrate 10 and the sealing substrate 20. A polarizer film or a color film may be further included on the sealing substrate 20. The display part D on the substrate 10 may include a light-emitting area DA and a non-light-emitting area NDA which is outside the light-emitting area DA.

A pad electrode 110, which is electrically coupled (e.g., connected) to the TFT and the OLED EL of the display part D, is included in the pad unit A of the substrate 10. Additionally, the pad electrode 110 is electrically coupled (e.g., connected) to a driver integrated circuit (IC) 16 which supplies a current for driving the organic light-emitting display apparatus 1. Accordingly, the pad electrode 110 may receive a current from the driver IC 16. The pad electrode 110 is coupled (e.g., connected) to various leads (not illustrated), for example, a data line, a scanning line, and/or a power-supply line for driving display elements included in the display part D. Thus, the pad electrode 110 may transmit an external signal to the OLED EL included in the display part D via the coupled (e.g., connected) leads. The pad electrode 110 may be formed to have a width of hundreds to thousands micrometer (μm).

In FIG. 2, the pad unit A is formed only on one side of the outside of the display D. However, this is only an example, and the present invention is not limited thereto. For example, in embodiments of the present invention the pad unit A may be formed on at least one side of the outside of the display D.

The top plate 50 includes a light transmission layer 52 and a non-light-transmission layer 54. The light transmission layer 52 may be formed of transparent glass. However, the light transmission layer 52 is not limited thereto, and may be formed of various materials such as transparent plastic, metal, and the like. Wide-area metal patterns and keys of the top plate may be formed on the non-light-transmission layer 54. A metal layer, for example, a reflective layer such as an aluminum (Al) foil, may be further included below the non-light-transmission layer 54.

In order to attach the display panel module 30 and the top plate 50, a resin 40 may be coated therebetween and cured by radiating ultraviolet (UV) rays. The UV rays may be radiated on a top, bottom, and/or side of the organic light-emitting display apparatus 1. However, an amount of UV ray transmission to the resin 40, on the pad unit A of the substrate 10, may be small due to the non-light-transmission layer 54 on the top plate 50 and the pad electrode 110, with a wide width, in the pad unit A provided on the substrate 10. The organic light-emitting display 1, according to aspects of the present invention, may reduce (or prevent) uncuring of the resin 40, by employing a structure of the pad electrode 110 that may improve an efficiency of UV-ray utilization.

Figure 3:
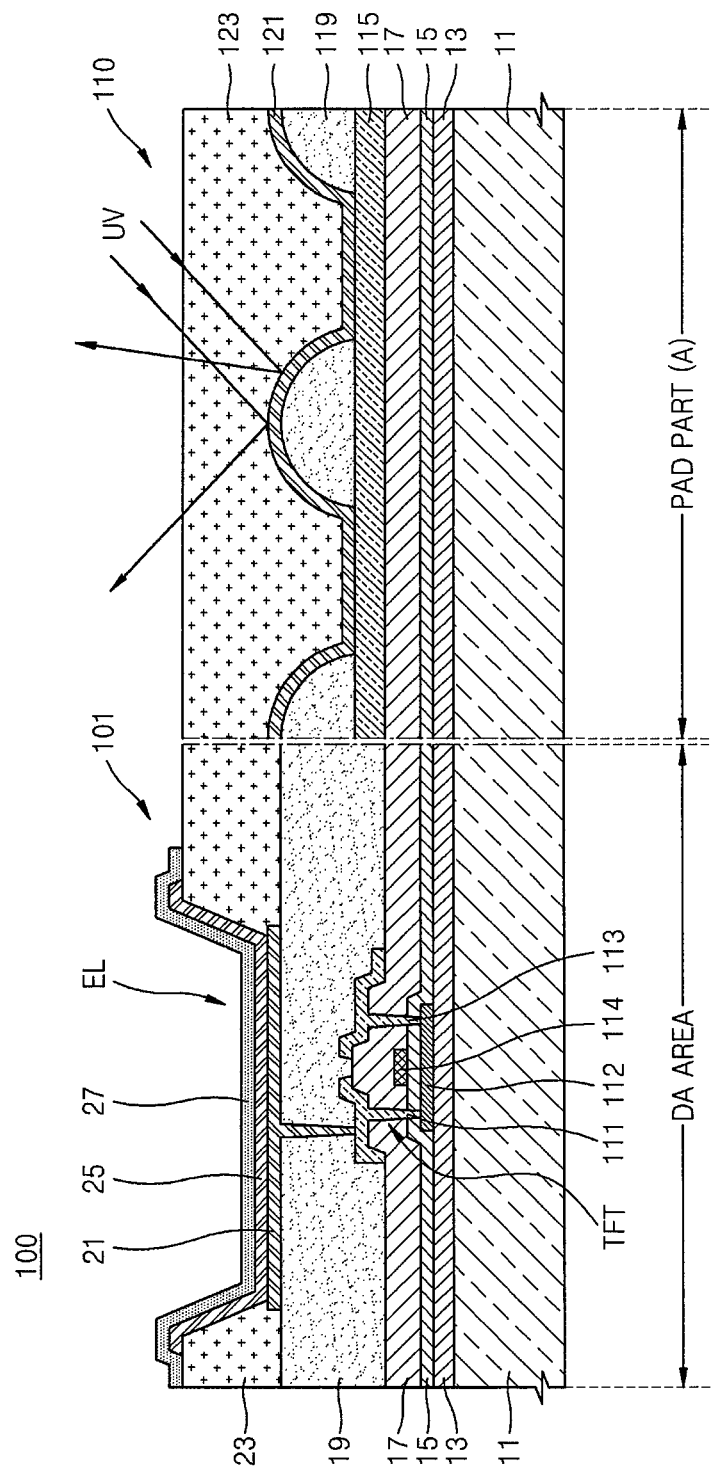
FIG. 3 is a cross-sectional view of the organic light-emitting display apparatus taken along the line X-X' of FIG. 2, for illustrating an organic light-emitting display apparatus which includes a pad electrode according to an embodiment of the present invention.

FIG. 3 is a cross-sectional view of the organic light-emitting display apparatus taken along the line X-X' of FIG. 2, for illustrating an organic light-emitting display apparatus 100 which includes a pad electrode 110 according to an embodiment of the present invention.

Referring to FIG. 3, the organic light-emitting display 100 includes a light-emitting area, which is in a DA area 101 of a display part D, and a pad electrode 110.

The DA area 101 includes a TFT and an OLED EL, which includes an organic light-emitting layer 25, on a substrate 11 and/or an auxiliary layer 13.

The substrate 11 may be formed of transparent glass having silicon dioxide ($SiO_2$) as a main component. However, the substrate 11 is not limited thereto, and may be formed of various materials such as transparent plastic, metal, and the like.

The auxiliary layer 13, such as a barrier layer, a blocking layer, and/or a buffer layer, may be included on the substrate 11 to reduce (or prevent) spread of impurity ions, reduce (or prevent) inflow of moisture or external air, and planarize an upper surface of the substrate 11. The auxiliary layer 13 may be formed of $SiO_2$ and/or silicon nitride ($SiN_x$) by using various deposition methods such as plasma-enhanced chemical vapor deposition (PECVD), atmospheric pressure chemical vapor deposition (APCVD), low pressure CVD (LPCVD), and the like.

The TFT includes an active layer 112, a gate electrode 114, and source/drain electrodes 113 and 111. A gate insulating member 15 is interposed between the gate electrode 114 and the active layer 112 to insulate the gate electrode 114 from the active layer 112. The active layer 112 may be formed of an inorganic semiconductor such as amorphous silicon or poly silicon, or an organic semiconductor. In some embodiments, the active layer 112 may be formed of an oxide semiconductor. For example, the oxide semiconductor may include an oxide of at least one material selected from metal elements in groups 12 through 14 consisting of zinc (Zn), indium (In), gallium (Ga), stannum (Sn), cadmium (Cd), germanium (Ge), and hafnium (Hf), and a combination thereof.

In addition, source/drain areas may be formed to correspond to both edges of the active layer 112. The source/drain areas may be coupled (e.g., connected) to the source/drain electrodes 113 and 111, respectively.

The gate electrode 114 is formed on the gate insulating member 15, and an interlayer insulating member 17 is formed to cover the gate electrode 114 and the gate insulating member 15. The source electrode 113 and the drain electrode 111 are formed on the interlayer insulating member 17, and a planarization layer 19 is disposed to cover the source electrode 113 and the drain electrode 111.

The gate insulating member 15, the interlayer insulating member 17, and a planarization layer 19 may be formed of an insulating material, and may also be formed in a stacked structure of a single layer or multiple layers which includes an inorganic material, an organic material, or a combination thereof, by using various deposition methods. The stacked structure of the TFT is only an example, and various structures may be used for the TFT.

The OLED EL includes an anode electrode 21 which is coupled (e.g., connected) to one of the source/drain electrodes 113 and 111 of the TFT, a cathode electrode 27 which is formed to face the anode electrode 21, and an organic light-emitting layer 25 interposed therebetween.

The anode electrode 21 of the OLED EL is formed on the planarization layer 19, and a pixel-defining layer 23 is formed to cover the anode electrode 21 and the planarization layer 19. The pixel-defining layer 23 may be formed by using resin, such as polyacrylates or polyimides, or a silica-based inorganic material. An opening (e.g., a predetermined opening) is formed in the pixel-defining layer 23, and the organic light-emitting layer 25 of the OLED EL may be formed in an area limited to the opening. Then, the cathode electrode 27 of the OLED EL may be formed to cover all of the electrodes. In some embodiments, the anode electrode 21 and the cathode electrode 27 may be changed with each other.

The anode electrode 21 may be formed of a transparent electrode or a reflective electrode. If formed of a transparent electrode, the anode electrode 21 may include ITO, IZO, ZnO, or $In_2O_3$. Otherwise, if formed of a reflective electrode, the anode electrode 21 may include a reflective layer, formed of silver (Ag), magnesium (Mg), Al, Pt, palladium (Pd), Au, Ni, Nd, Ir, Cr, or a compound thereof, and a transparent layer, formed of ITO, IZO, ZnO, or $In_2O_3$. In some embodiments, the anode electrode 21 may be formed of a reflective electrode with a structure of ITO/Ag/ITO.

The cathode electrode 27 may also be formed of a transparent electrode or a reflective electrode. If formed of a transparent electrode, the cathode electrode 27 may include a layer formed to face the organic light-emitting layer 25 by depositing Li, Ca, LiF/Ca, LiF/Al, Al, Mg, or a compound thereof, and an auxiliary electrode or a bus electrode line formed of a transparent conductive material such as ITO, IZO, ZnO, or $In_2O_3$ on the layer. If formed of a reflective electrode, the cathode electrode 27 may be formed of Li, Ca, LiF/Ca, LiF/Al, Al, Mg, or a compound thereof.

A low-molecular weight organic material or a polymer organic material may be employed as the organic light-emitting layer 25 which is disposed between the anode electrode 21 and the cathode electrode 27. When the organic light-emitting layer 25 is formed of a low-molecular weight organic material, a hole injection layer (HIL), a hole transport layer (HTL), an electron transport layer (ETL), and/or an electron injection layer (EIL), which are not illustrated, may be stacked to form a single layer or multiple layer structure, having the organic light-emitting layer 25 therebetween. Various organic materials, such as a copper phthalocyanine (CuPc), a N,N'-Di(naphthalene-1-yl)-N,N'-diphenyl-benzidine (NPB), or a tris-8-hydroxyquinoline aluminum (Alq3), may be used to form the organic light-emitting layer 25. In one embodiment, the low-molecular weight organic material may be formed on the masks by using a vacuum deposition method.

When the organic light-emitting layer 25 is formed of a polymer organic material, the HTL (not illustrated) may be further included between the organic light-emitting layer 25 and the anode electrode 21. The HTL may be formed of poly(3,4-ethylenedioxythiophene) (PEDOT) and the organic light-emitting layer 25 may be formed of a polymer organic material such as PPV (Poly-Phenylenevinylene) or Polyfluorene. The organic light-emitting layer 25 may include a unit pixel which is formed of sub-pixels that respectively emit red, green, or blue lights.

According to an embodiment of the present invention, as an example, the organic light-emitting layer 25 is formed on the opening in the pixel-defining layer 23, and separate light-emitting materials are formed for each pixel. However, the present invention is not limited thereto. The organic light-emitting layer 25 may also be formed on the entire planarization layer 19, regardless of a location of pixels. The organic light-emitting layer 25 may be formed, for example, by vertically stacking or mixing layers which include light-emitting materials emitting red, green, and blue lights. If the organic light-emitting layer is capable of emitting a white light, different colors may also be combined. Additionally, a color conversion layer for converting the emitted white light into a color (e.g., a predetermined color), or a color filter may be further included.

The pad electrode 110 includes a conductive layer 115 which is electrically coupled (e.g., connected) to the display part D, shown in FIG. 2, on the substrate 11 and/or the auxiliary layer 13, and a conductive reflective layer 121, with an embossing (or embossed) shape, on the conductive layer 115. The pad electrode 110 may further include an insulating member 119 located on portions of (or in a partial area of) the conductive layer 115. The substrate 11 which extends from the DA area 101, the auxiliary layer 13, the gate insulating member 15, and/or the interlayer insulating member 17 may be further included below the conductive layer 115.

The conductive layer 115 is electrically coupled (e.g., connected) to the TFT and/or the OLED EL of the display part D shown in FIG. 2, that is, the DA area 101. The conductive layer 115 may transmit an external signal, applied from the driver integrated circuit (IC) 16 shown in FIG. 2, to the TFT and/or the OLED EL. The conductive layer 115 may be formed of various conductive materials. For example, the conductive layer 115 may be formed to include metal, for example, Ag, Al, Ti, Ni, Au, Ti/Au, Ni/Au, Ni/Ag, and/or Ti/Al/Ti. In some embodiments, the conductive layer 115 may be formed of the same material as the source/drain electrodes 113 and 111 of the DA area 101. In some embodiments, the conductive layer 115 may be formed of the same material and formed concurrently with (e.g., at the same time as) the source/drain electrodes 113 and 111 of the DA area 101.

The insulating member 119 may be located on portions of (or in a partial area of) the conductive layer 115. The insulating member 119 may be formed of the same material as the planarization layer 19 of the DA area 101. In order to form the insulating member 119, the insulating member 119 may be deposited concurrently with the planarization layer 19 of the DA area 101 (e.g., simultaneously when the planarization layer 19 of the DA area 101 is deposited), and may be patterned by using photolithography and an etching process. The conductive layer 115 may be exposed through such patterning, and a plurality of the insulating members 119 may be formed on the conductive layer 115.

The conductive reflective layer 121 may be formed to cover the conductive layer 115 and the insulating member 119. Accordingly, the conductive reflective layer 121 may include an embossing shape. In some embodiments, the conductive reflective layer 121 may be formed in a structure of a single layer or multiple layers which includes at least one material with high reflectivity, such as Ag, silver oxide ($Ag_2O$), Al, Zn, titanium (Ti), rhodium (Rh), Mg, Pd, and ruthenium (Ru). For example, the conductive reflective layer 121 may be formed of ITO/Ag/ITO.

The conductive reflective layer 121 may be formed of the same material as the anode electrode 21 of the DA area 101. The conductive reflective layer 121 may be deposited concurrently with the anode electrode 21 (e.g., simultaneously when the anode electrode 21 is deposited). In some embodiments, the conductive reflective layer 121 may be formed to directly contact the portion of the conductive layer 115 on which the insulating member 119 is not formed, and may be electrically coupled (e.g., connected) to the conductive layer 115. In some embodiments, the conductive reflective layer 121 is electrically coupled (e.g., connected) to the TFT and/or the OLED EL of the display part D shown in FIG. 2, that is, the DA area 101. Thus, the conductive layer 115 may transmit an external signal, applied from the driver integrated circuit (IC) 16 shown in FIG. 2, to the TFT and/or the OLED EL.

As such, the conductive reflective layer 121 may include an embossing shape, and may be formed of a material with high reflectivity to light. Thus, diffusion of reflected light, exposed to the pad unit A, may be induced, and efficiency of light utilization may be improved. For example, as described by referring to FIG. 1, in order to attach the display panel module 30 and the top plate 50, the resin 40 on the pad unit A may be more easily cured by increasing an efficiency of UV-ray utilization for curing the resin 40.

Additionally, like the conductive layer 115, the conductive reflective layer 121 may function as a wiring for transmitting a signal to the TFT. An entire wiring resistance of the pad electrode 110 may be reduced, and thus, a width of the pad electrode 110 may be reduced.

A protective layer 123, formed of an insulating material, may be provided on the conductive reflective layer 121. The protective layer 123 may be formed of the same material as the pixel-defining layer 23 of the DA area 101. In some embodiments, the protective layer 123 may be formed concurrently (e.g., simultaneously) with the pixel-defining layer 23. The protective layer 123 may function to reduce (or prevent) corrosion of the conductive reflective layer 121.

Figure 4:
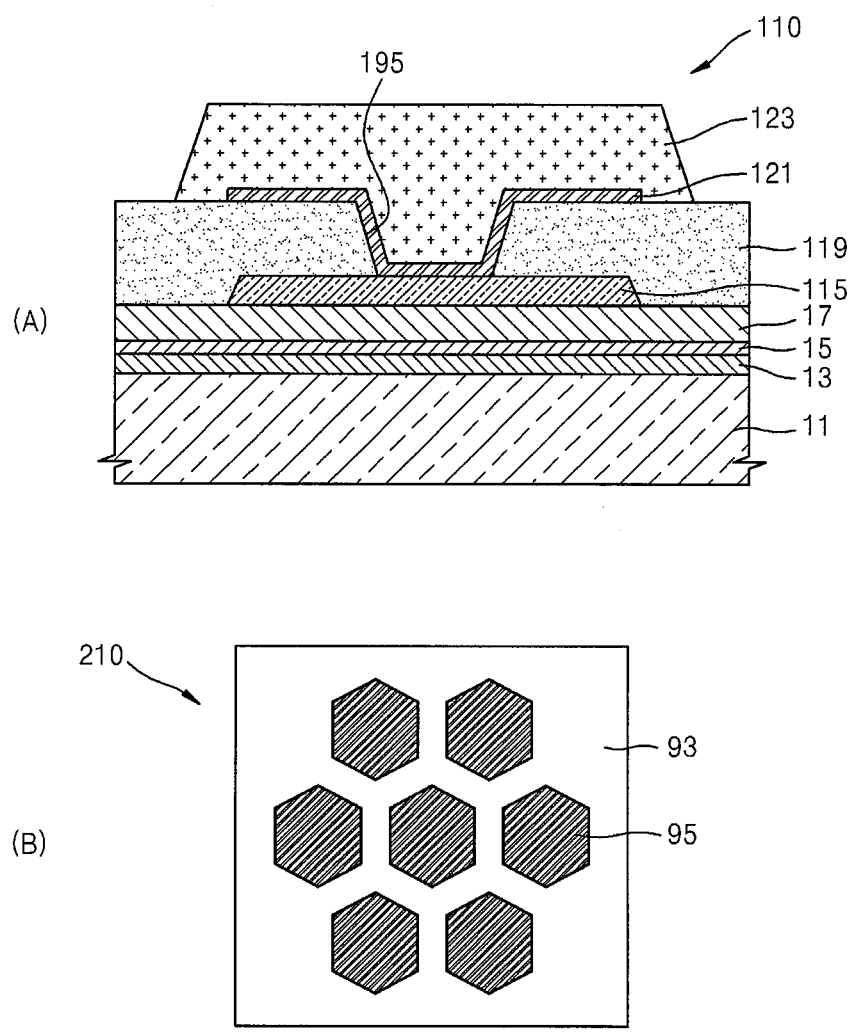
FIGS. 4A and 4B are cross-sectional views of the organic light-emitting display apparatus, taken along the line Y-Y' of FIG. 2, for illustrating a pad electrode of an organic light-emitting display apparatus according to an embodiment of the present invention.

FIGS. 4A and 4B are cross-sectional views of the organic light-emitting display apparatus, taken along the line Y-Y' of FIG. 2, for illustrating the pad electrode 110 included in the organic light-emitting display apparatus according to an embodiment of the present invention. In FIGS. 4A and 4B, like reference numerals as shown in FIG. 3 denote like elements, and thus their description may not be provided here.

FIG. 4A is a cross-sectional view of the pad electrode 110 according to an embodiment, and FIG. 4B is a cross-sectional view of a mask 210 for forming a conductive reflective layer 121 of the pad electrode 110 according to an embodiment.

In order to form the conductive reflective layer 121, an insulating layer is deposited on the conductive layer 115, and a photolithography process may be performed by using the mask 210. Then, an opening 195 is formed to correspond to a first pattern 95 of the mask 210, and thus, an insulating member 119 may be formed (or completed). A size and an inclination angle of the opening 195 may be changed according to a material, a thickness, and an exposure condition of the insulating member 119. Then, the conductive reflective layer 121 is deposited to cover the insulating member 119 with a thickness (e.g., a certain thickness), thus forming the conductive reflective layer 121 with an embossing shape.

In some embodiments, a size of the first pattern 95 may be several μm, and a distance between the first patterns 95 may be several μm. However, the size of and the distance are not limited thereto, and the size of the first pattern 95 may be almost the same as a width of the conductive layer 115. Additionally, in FIG. 4, a shape of the first pattern 95 is a hexagon, but it is not limited thereto. The first pattern may be formed of various shapes such as a circle, or a polygon. Additionally, the first pattern 95 may be shaped irregularly or unevenly.

FIGS. 5 through 9 are schematic diagrams illustrating pad electrodes 120, 130, 140, 150 and 160 included in the organic light-emitting display apparatus 1 of FIG. 2, according to another embodiment of the present invention. In FIGS. 5 through 9, like reference numerals as shown in FIG. 3 denote like elements, and thus their description may not be provided here.

Figure 5:
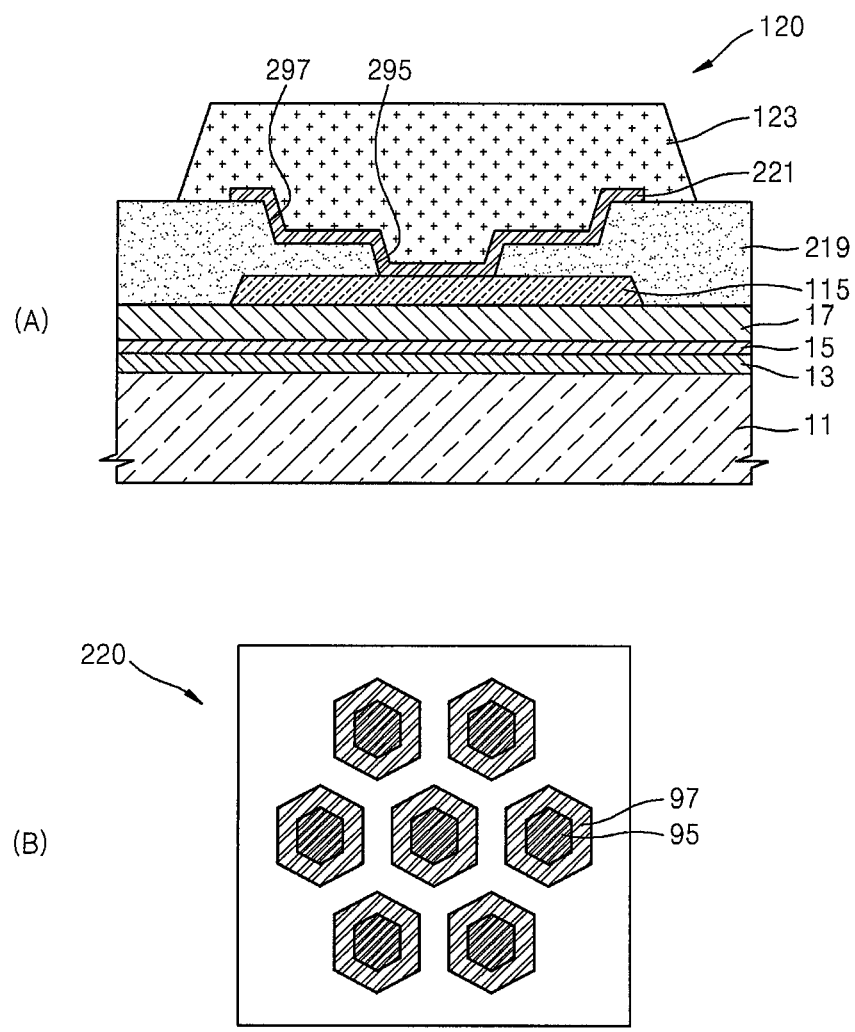
Figure 6:
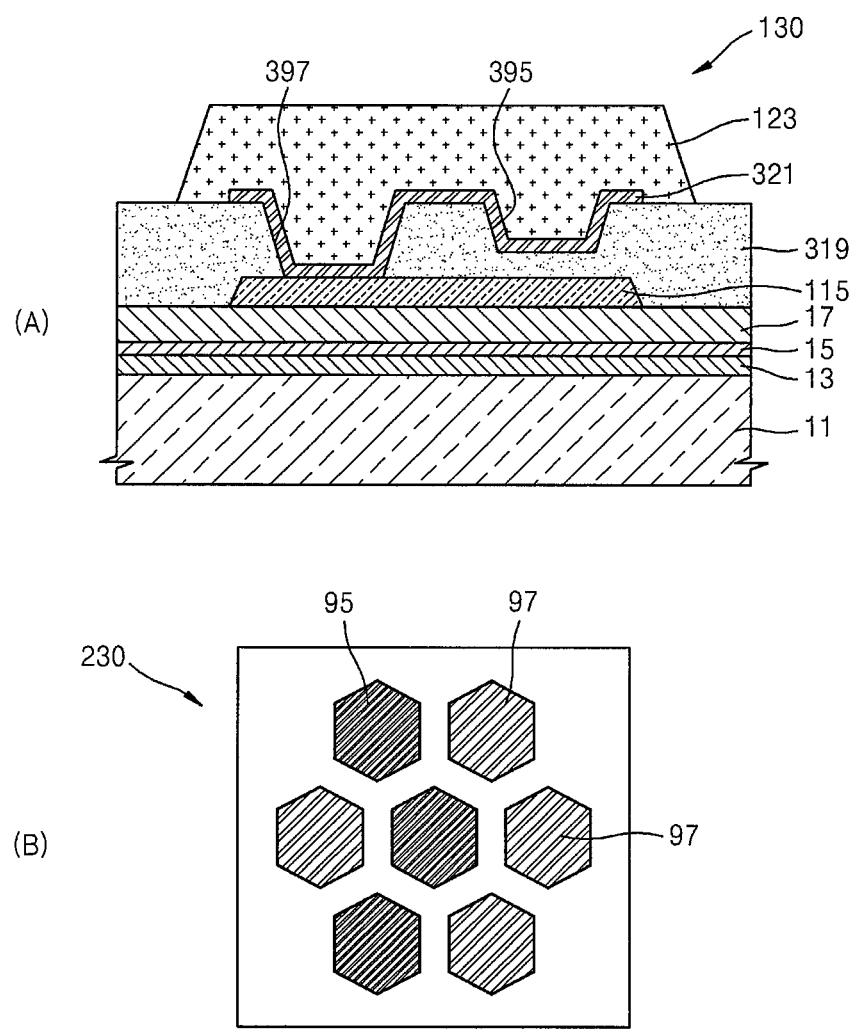

Referring to FIGS. 5 through 7, a second pattern 97 formed in a half-tone is formed on the mask 220, and an insulating layer is etched by using the second pattern 97. Thus, first openings 295, 395, and 495 and second openings 297, 397, 497 may be formed to have different depths from each other. Accordingly, insulating members 219, 319, and 419 may have various heights and shapes, and conductive reflective layers 221, 321, and 421 may have various embossing shapes. That is, the embossing shape may have a phase difference according to heights as shown in FIG. 5, and may have various depths as shown in FIG. 6. An inclined portion of the embossing shape may also be formed in an asymmetrical structure as shown in FIG. 7.

Figure 8:
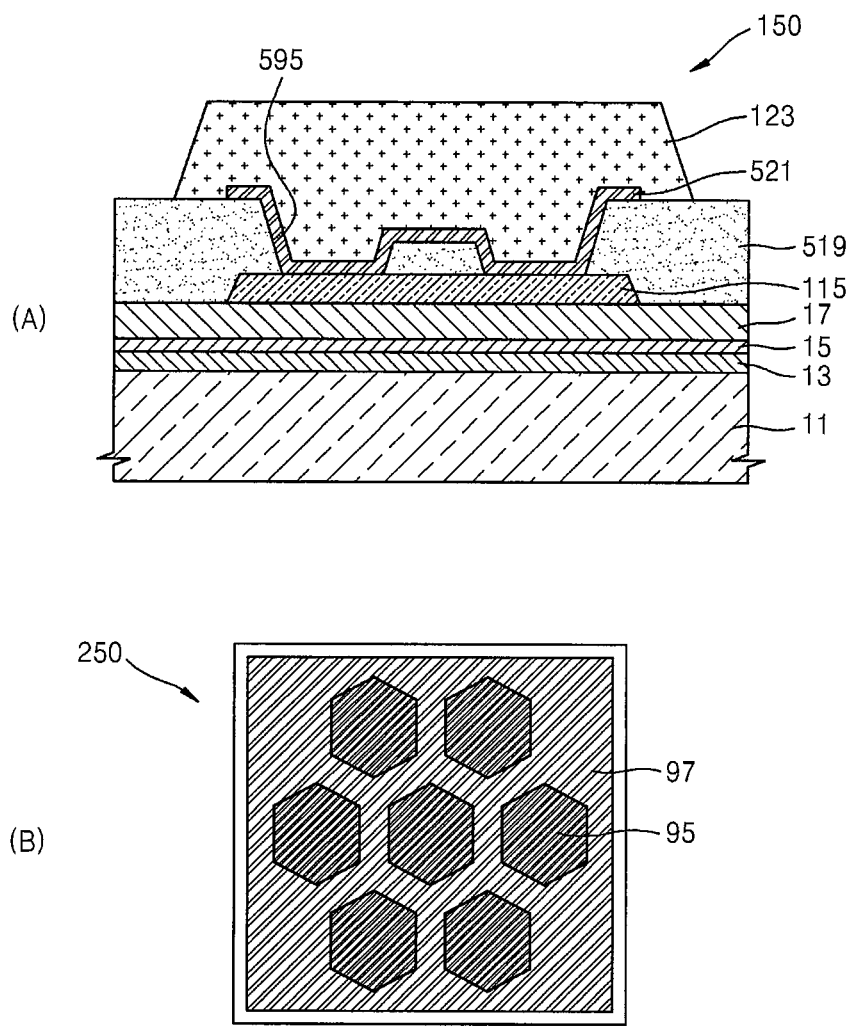
Figure 9:
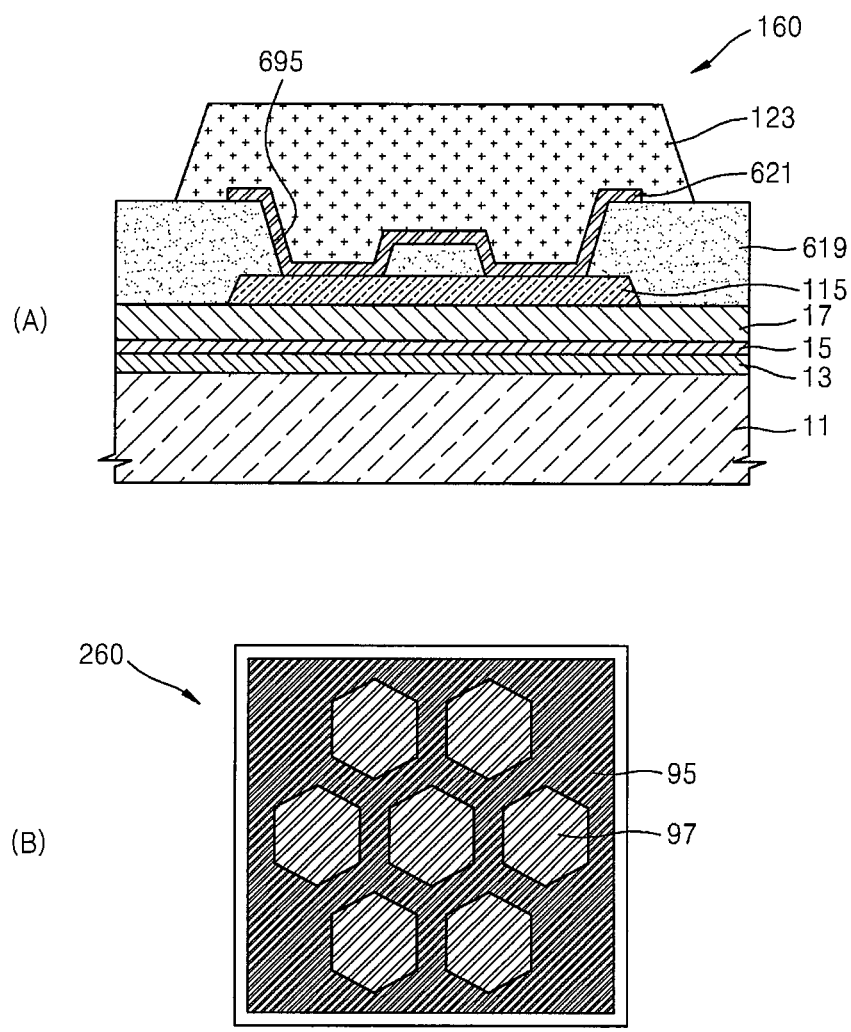

Referring to FIGS. 8 and 9, the second pattern 97, formed in a half tone, may be formed entirely on the mask, and the first pattern 95, formed in a full tone, may be formed at a center of the second pattern 97. On the other hand, the first pattern 95 may be formed entirely on the mask, and then, the second pattern 97, formed in a half tone, may be formed at a center of the first pattern 95. By using this, a height of the embossing shape on the insulating members 519 and 619 and the conductive reflective layers 521 and 621 may be varied (or formed variously).

However, the shape of the pad electrode is not limited to the embodiments described above, and a pad electrode may be formed by combining various shapes as provided, for example, in FIGS. 4 through 9.

In the embodiments described above, the organic light-emitting display apparatus is described as an example. However, the present invention is not limited thereto, and various display elements such as a liquid-crystal display (LCD) may be used.

Only one TFT is illustrated in drawings for describing embodiments of the present invention, for convenience of description, and only one capacitor may be included. However, the present invention is not limited thereto. For example, according to embodiments of the present invention, a plurality of TFTs and capacitors may be included, provided that the number of mask processes does not increase.

An organic light-emitting display apparatus according to embodiments of the present invention employs a pad electrode which includes an embossing-shaped conductive reflective layer. Thus, a utilization efficiency of UV rays may be improved when the display panel module is attached to the front plate by using a UV-cured resin.

The pad electrode may be a layer for transmitting a signal for driving an organic light-emitting diode. The pad electrode may include a conductive layer and a conductive reflective layer, thus reducing a wiring resistance. A reduction in a wiring resistance may help to expand a range for adjusting a width of the pad electrode.

While the present invention has been particularly shown and described with reference to example embodiments thereof, it will be understood by those of ordinary skill in the art that various changes in form and details may be made therein without departing from the spirit and scope of the present invention as defined by the following claims and their equivalents.

What is claimed is:

1. An organic light-emitting display apparatus, comprising:
   a substrate;
   a display part on the substrate and configured to display an image, the display part comprising a thin-film transistor (TFT) and an organic light-emitting diode (OLED); and
   a pad electrode on the substrate and outside the display part,
   wherein the pad electrode comprises:
      a conductive reflective layer having an embossed shape comprising at least one convex shape and a plurality of concave shapes;
      a conductive layer between the substrate and the conductive reflective layer; and
   a plurality of insulating members each having an embossed shape comprising at least one convex shape, the plurality of insulating member being at a partial area between the conductive layer and the conductive reflective layer and having a bottom surface that entirely contacts the conductive layer.

2. The organic light-emitting display apparatus of claim 1, wherein the conductive layer is electrically coupled to the TFT or the OLED and is configured to transmit an external signal.

3. The organic light-emitting display apparatus of claim 2, wherein the conductive layer and the conductive reflective layer are electrically coupled to each other in a remaining area.

4. The organic light-emitting display apparatus of claim 3, wherein a height of at least one of the insulating members is different from a height of at least another one of the insulating members.

5. The organic light-emitting display apparatus of claim 1, wherein the conductive reflective layer comprises a plurality of embossed shapes having different heights.

6. The organic light-emitting display apparatus of claim 1, wherein the conductive reflective layer is electrically coupled to the TFT or the OLED, and is configured to transmit an external signal.

7. The organic light-emitting display apparatus of claim 1, wherein the OLED comprises an anode electrode layer, an organic light-emitting layer on the anode electrode layer, and a cathode electrode layer on the organic light-emitting layer, and
   wherein the conductive reflective layer is formed concurrently with the anode electrode layer.

8. The organic light-emitting display apparatus of claim 7, wherein the conductive reflective layer comprises a same material as the anode electrode layer.

9. The organic light-emitting display apparatus of claim 2, wherein the TFT comprises an active layer, a gate electrode insulated from the active layer, an interlayer insulating member which covers the gate electrode, and a source electrode and a drain electrode, which are on the interlayer insulating member and contact the active layer, and
   wherein the conductive layer is formed concurrently with the source electrode and the drain electrode.

10. The organic light-emitting display apparatus of claim 9, wherein the conductive layer comprises a same material as the source electrode and the drain electrode.

11. The organic light-emitting display apparatus of claim 1, wherein the pad electrode further comprises a protective layer on the conductive reflective layer.

* * * * *